United States Patent [19]

Fisher

[11] Patent Number: 4,519,782
[45] Date of Patent: May 28, 1985

[54] ESCAPE SLIDE AND LIFE RAFT

[75] Inventor: John M. Fisher, Cuyahoga Falls, Ohio

[73] Assignee: The B. F. Goodrich Company, New York, N.Y.

[21] Appl. No.: 356,866

[22] Filed: Mar. 10, 1982

Related U.S. Application Data

[63] Continuation of Ser. No. 122,334, Feb. 19, 1980, abandoned.

[51] Int. Cl.³ .................. B63C 9/04; B64D 25/14
[52] U.S. Cl. .............................. 441/40; 182/48; 193/25 B; 244/DIG. 2; 244/137 P
[58] Field of Search ........................... 441/40–42, 441/83, 125, 80; 244/137 P, DIG. 2; 182/48; 193/25 B

[56] References Cited

U.S. PATENT DOCUMENTS

| | | | |
|---|---|---|---|
| 3,463,266 | 8/1969 | Day | 244/DIG. 2 |
| 3,679,025 | 7/1972 | Rummel | 244/DIG. 2 |
| 3,827,094 | 8/1974 | Fisher | 182/48 |
| 3,833,088 | 9/1974 | Chacko et al. | 244/DIG. 2 |
| 3,860,984 | 1/1975 | Fisher | 182/48 |
| 4,018,321 | 4/1977 | Fisher | 193/25 B |

FOREIGN PATENT DOCUMENTS

| | | | |
|---|---|---|---|
| 1201914 | 8/1970 | United Kingdom | 193/25 B |
| 1206936 | 9/1970 | United Kingdom | 182/48 |

*Primary Examiner*—Sherman D. Basinger
*Attorney, Agent, or Firm*—Harry F. Pepper, Jr.; Woodrow W. Ban

[57] ABSTRACT

An escape slide and life raft assembly for evacuating personnel from an aircraft or other elevated place and thereafter providing a floating support when the evacuation is on water. A slide portion of the assembly has side tubes connected to transverse and longitudinal tubes of an outrigger portion to provide additional seating capacity of the assembly when used as a life raft. Upon inflation and extension of the slide portion, the outrigger portion is reefed or held in against the side tubes and only partially inflated so that the partially inflated longitudinal tubes reinforce the side tubes of the slide portion. When the outrigger portion is fully inflated and extended by releasing the reefing, the pressure in the assembly will be reduced due to the increased volume of the inflatable support tubes; however, the reduced pressure is at a preferred level for operation of the assembly as a life raft.

2 Claims, 9 Drawing Figures

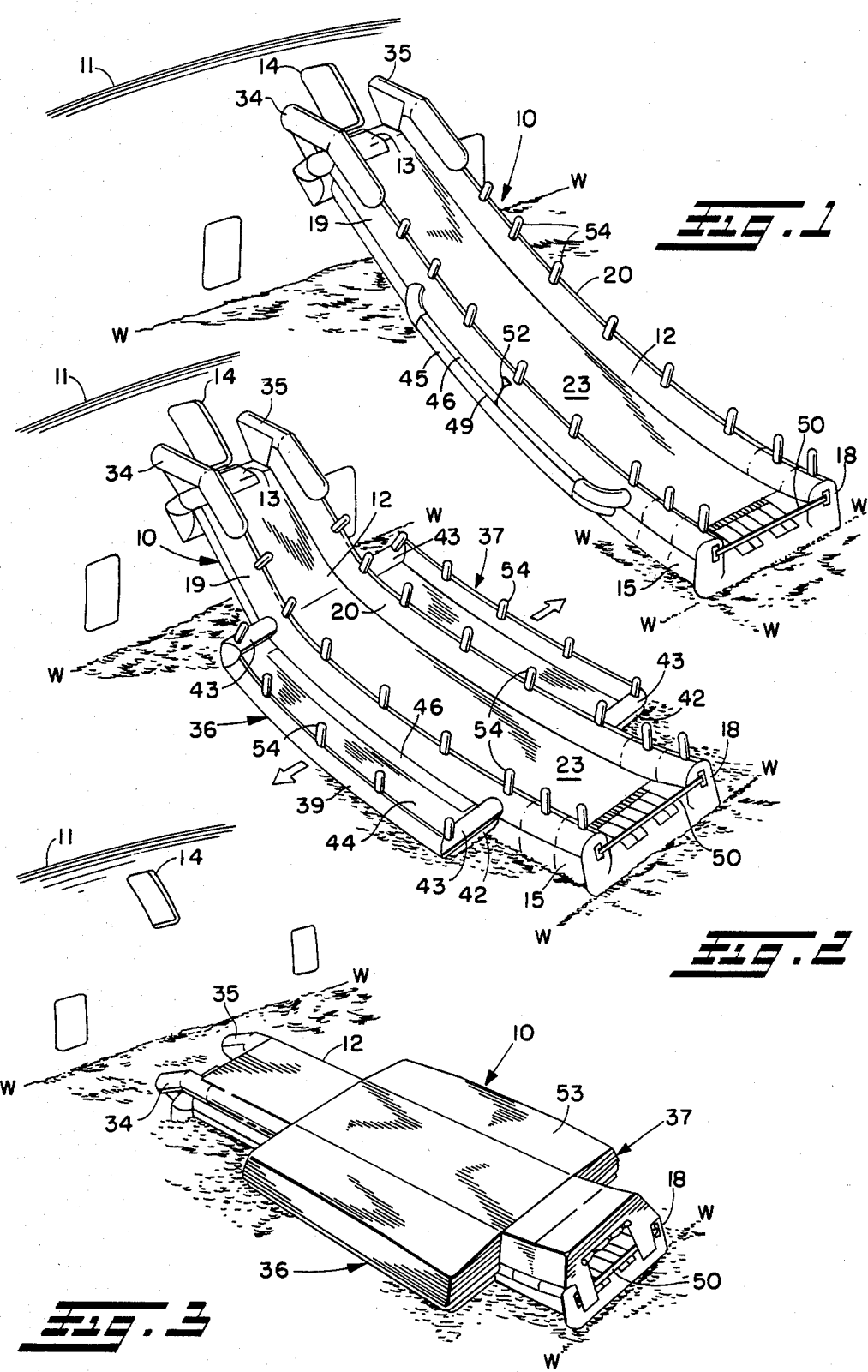

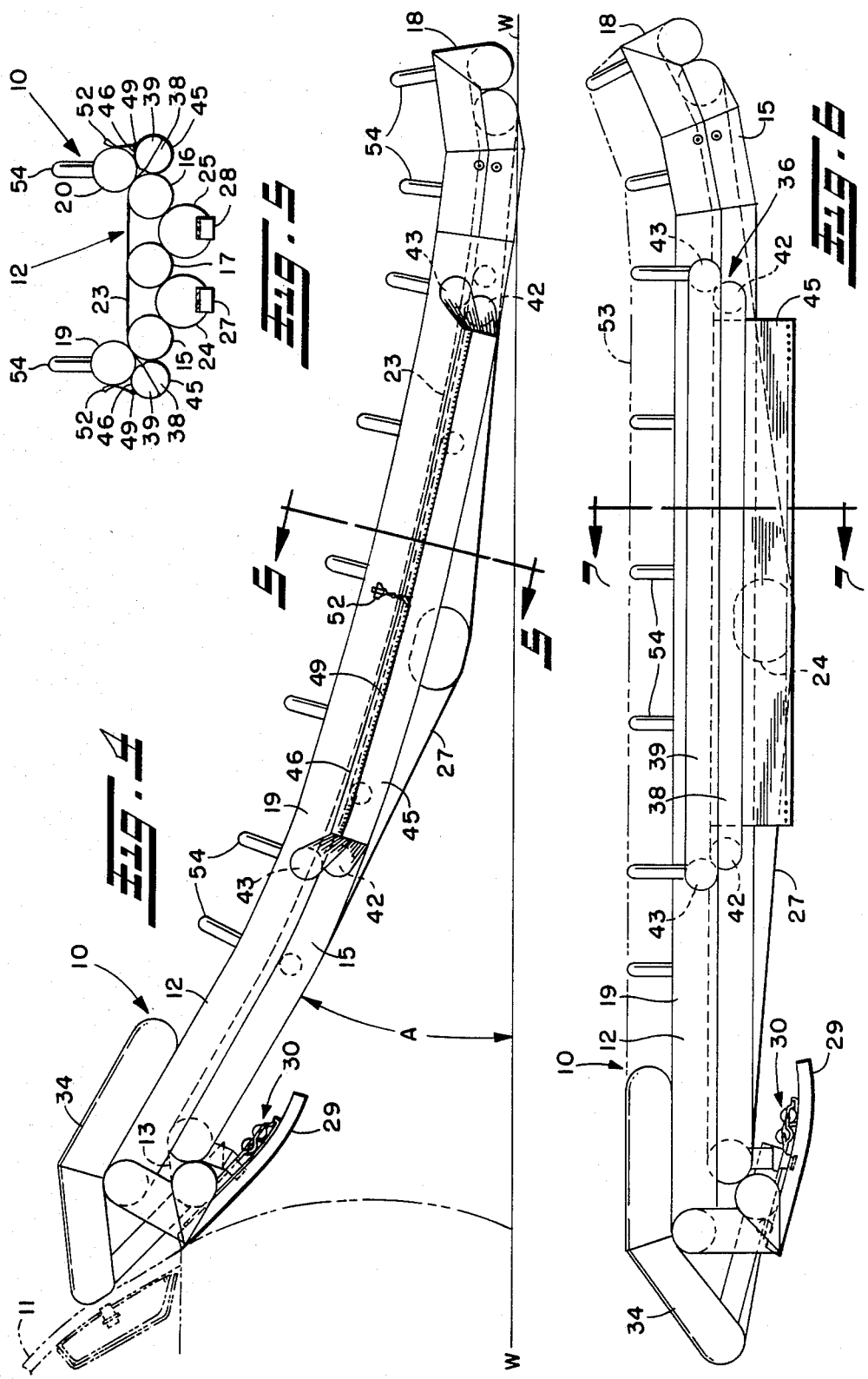

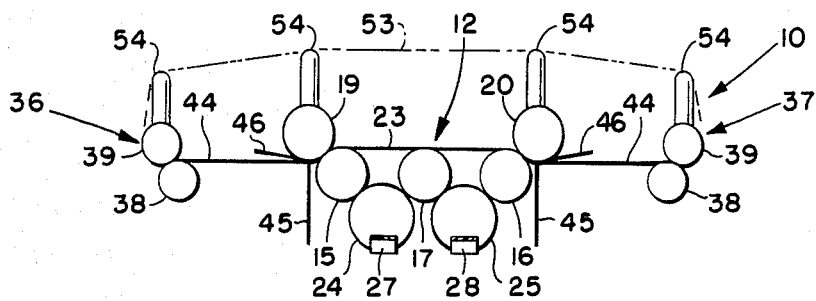
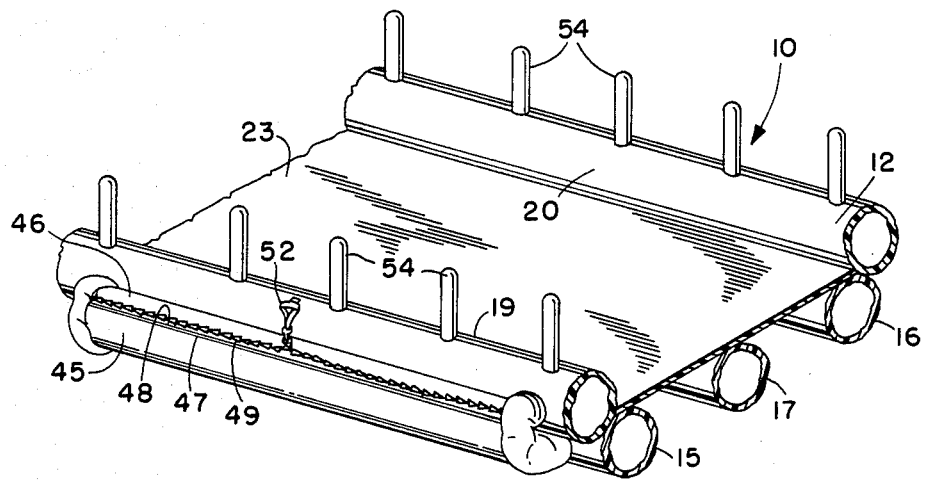
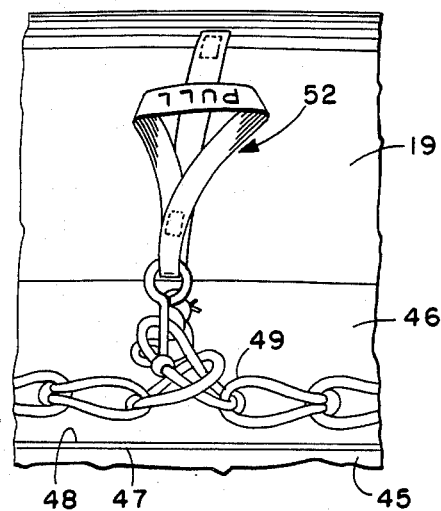

ESCAPE SLIDE AND LIFE RAFT

This is a continuation of application Ser. No. 122,334, filed Feb. 19, 1980, now abandoned.

BACKGROUND OF THE INVENTION

This invention relates to an inflatable aircraft evacuation system and especially to an inflatable escape slide and life raft assembly which may serve as a slide during evacuation and a raft when an aircraft is ditched in the water. With larger capacity aircraft and fewer doors located above the water during a ditching situation, the slide/life raft systems used heretofore have not had the seating space and bouyancy necessary to float the number of persons who are expected to leave the aircraft at one door. Although one solution to this problem is to make the slide larger, this has its limitations in view of the requirement that the slide needs to be deployable in a matter of seconds. Also the vulnerability of the assembly to wind forces is greater with a larger assembly. It is also necessary to limit the weight and storage space required for the slide while at the same time providing the structural integrity needed during operation.

SUMMARY OF THE INVENTION

Briefly, one aspect of the invention involves providing an outrigger portion extendable from the sides of the slide portion to provide additional space and support for personnel evacuated on the slide portion.

In accordance with another aspect of the invention, the outrigger portion is held in a reefed condition against the side rail tubes of the slide portion during the initial evacuation of personnel to reduce the vulnerability of the unit to distortion by wind forces.

In accordance with a further aspect of the invention, the outrigger portion is partially inflated in the reefed condition to provide reinforcement of the side tubes of the slide portion so that the size and weight of the side tubes may be reduced.

In accordance with a still further aspect of the invention, the outrigger portion is inflatable by the pressure of the gases in the slide portion upon release of the reefing.

BRIEF DESCRIPTION OF THE DRAWINGS

FIG. 1 is a partially schematic view in perspective of an inflatable slide and life raft assembly mounted on an aircraft floating in the water with the slide portion inflated and extended but with the outrigger portion in the reefed condition.

FIG. 2 is a view like FIG. 1 but showing the assembly after the outrigger portions have been fully extended and inflated.

FIG. 3 is a view like FIGS. 1 and 2 showing the assembly after being released from the aircraft and the canopy installed.

FIG. 4 is a side elevation of the assembly as shown in FIG. 1 with the aircraft fuselage shown in chain-dotted lines.

FIG. 5 is a schematic cross-sectional view taken on the plane of line 5—5 in FIG. 4.

FIG. 6 is a side elevation of the assembly as shown in FIG. 2 with the slide tilted in a horizontal position.

FIG. 7 is a schematic cross-sectional view taken on the plane of line 7—7 in FIG. 6.

FIG. 8 is a fragmentary view in perspective of the assembly as shown in FIG. 1 showing the slide portion inflated and the outrigger portion reefed by the reefing flaps which are connected by the release means.

FIG. 9 is an enlarged fragmentary view of the release means connecting the lower and upper reefing flaps and the actuating apparatus for the release means.

DETAILED DESCRIPTION

Referring to FIGS. 1, 4 and 5, a multitubular inflatable escape slide and life raft assembly 10 is shown in the inflated condition in position for evacuating passengers from an elevated supporting structure such as an aircraft having a fuselage 11 shown schematically in FIG. 1 and in chain-dotted lines in FIG. 4. A slide portion 12 of the assembly 10 is shown in a position for evacuating passengers from the aircraft with the fuselage 11 partially submerged in water after the aircraft has been ditched. The waterline is indicated by lines W—W in the drawings. As shown in FIG. 4, the slide portion 12 is positioned at an angle A of approximately 30 degrees for evacuating personnel with the fuselage 11 in the ditched position. It is understood that when passengers are evacuated from the aircraft to the ground, the inclination of the slide portion 12 may be at an angle A of from approximately 34 degrees to 48 degrees to the horizontal.

The slide portion 12 in the inflated condition has a generally horizontal platform 13 at the girt end which is fastened to the fuselage 11 at a doorway 14 in the fuselage. As shown in FIGS. 4 and 5, the slide portion 12 has a multitubular construction including a left-hand lower side tube 15, a right-hand lower side tube 16, and a central main tube 17, all of which extend longitudinally of the slide portion from the platform 13 to a toe end 18 of the slide portion. The side tubes 15 and 16 and the central main tube 17 may be connected by separating tubes (not shown). The slide portion 12 also has a longitudinally extending left-hand upper side rail tube 19 mounted on the top of the left-hand lower side tube 15 and a right-hand upper side rail tube 20 mounted on the right-hand lower side tube 16. A center slide panel 23 is fastened to the lower side tubes 15 and 16 and to the central main tube 17 between the upper side rail tubes 19 and 20 providing a slide surface on which the passengers may slide to the toe end 18 during evacuation of the aircraft.

Truss tubes 24 and 25 may be fastened to the undersides of the lower side tubes 15 and 16 and the central main tube 17 at positions approximately one-half the length of the slide portion 12 from the ends of the slide. Elongated longitudinally extending slide reinforcing tension members in the form of straps 27 and 28 engage the lower surface of the truss tubes 24 and 25 and are fastened to the underside of the slide portion at positions near the toe end 18 and platform 13.

An upper deck door 29 becomes part of the slide portion 12 and an inflation system 30 is mounted on the door for inflating the slide portion. The inflation system 30 is of a sufficient size to inflate the slide portion 12 in about two seconds inflation time to a pressure of about three pounds per square inch (0.21 kilograms per square centimeter).

The slide portion 12 may be constructed of a suitable flexible material such as square-woven nylon fabric impregnated with neoprene to retain air or other inflation medium in the inflatable parts. The straps 27 and 28 and the slide panel 23 may also be of square-woven nylon and adhered to the slide portion 12 by a suitable adhesive. The inflatable tubes 15, 16, 17, 19, 20, 24 and 25 may be of a nylon fabric which is stretchable at the inflation pressure of three pounds per square inch (0.21 kilograms per square centimeter) for operation of the slide portion 12 but contractible at lower pressures to reduce the volume of the assembly.

Other parts may be incorporated in the slide portion 12 such as rail tubes 34 and 35 which are fastened to the upper side rail tubes 19 and 20, respectively.

As shown in FIGS. 2, 6 and 7 of the escape slide and life raft assembly 10, outrigger portions 36 and 37 are positioned at each side of the slide portion 12 adjacent the side tubes 15 and 16 and side rail tubes 19 and 20. Since each of the outrigger portions 36 and 37 are of similar construction, the following description will be directed to outrigger portion 36 with the understanding that the outrigger portion 37 has the same construction. Similar parts for outrigger portion 37 will be designated with the same numerals as the parts for outrigger portion 36.

A lower side support tube 38 and an upper side support tube 39 of the outrigger portion 36 extend longitudinally of the assembly 10 at a spaced position from the lower side tube 15 and upper side rail tube 19 of the slide portion 12. Lower transverse support tubes 42 and upper transverse support tubes 43 of the outrigger portion 36 are attached to the left-hand lower side tube 15 and left-hand upper side rail tube 19, respectively, for communication of the inflating gases from the slide portion 12 to the outrigger portion 36.

A passenger supporting panel member 44 extends between the left-hand lower side tube 15 of the slide portion 12 and the lower side support tube 38 and lower transverse support tubes 42 of the outrigger portion 36 for supporting the passengers. The panel member 44 may be of flexible sheet material such as square-woven nylon impregnated with neoprene.

A lower reefing flap 45 and an upper reefing flap 46 are attached to the escape slide and life raft assembly 10 and each of the flaps has one edge hingedly attached to the slide portion 12 at a suitable position such as between the left-hand lower side tube 15 and upper side rail tube 19. In the deflated condition of the outrigger portion 36, the reefing flaps 45 and 46 extend around the lower side support tube 38 and upper side support tube 39 of the outrigger portion and edges 47 and 48 of the reefing flaps are releasably connected by suitable fast-release apparatus such as speed lacing 49 which may be instantly released by pulling a release handle 52 attached to the left-hand upper side rail tube 19. As shown in FIGS. 5 and 8, the lower side support tube 38 and upper side support tube 39 of the outrigger portion 36 are partially inflated and provide reinforcement of the edges of the slide portion 12 so that the lower side tube 15 and upper side rail tube 19 may have a smaller diameter than would be necessary without the reinforcing support provided by the support tubes of the outrigger portion 36.

Because the escape slide and life raft assembly 10 will be used as a raft very infrequently, the assembly is designed with the outrigger portions 36 and 37 normally reefed in against the sides of the slide portion 12. Accordingly, when the slide portion 12 is inflated and extended in the position shown in FIGS. 1, 4 and 5, the amount of gas required is reduced because the outrigger portions 36 and 37 are only inflated to approximately 30 percent of their normal volume. After the passengers have escaped onto the slide portion 12, the slide is in a configuration shown in FIG. 2. The release handles 52 may then be pulled allowing the speed lacing 49 to unravel and the gas in the slide portion 12 to expand the outrigger portions 36 and 37. The pressure-to-volume relationship of the escape slide and life raft assembly 10 is such that an initial pressure of about three pounds per square inch (0.21 kilograms per square centimeter) in the slide portion 12 will be reduced to approximately one pound per square inch (0.07 kilograms per square centimeter) or higher. The effect of the stretched nylon fabric in the inflatable tubes of a slide portion 12 retracting to an unstretched condition under the reduced pressure will also tend to maintain the pressure within the assembly at a higher pressure than that calculated by comparing the change in inflatable volume. This feature permits possible higher raft operating pressures or lighter reefing of the assembly. After the outrigger portions 36 and 37 are inflated, the passengers may step into them and be seated on the passenger support panel members 44. Backrests are provided by the upper side support tubes 39 and upper side rail tubes 19 and 20 of the outrigger portions 36, 37 and slide portion 12.

When the first passenger or flight attendant slides down the slide portion 12, a passenger retention strap 50 is secured across the toe end 18 of the slide between side rail tubes 19 and 20 to prevent people from sliding off the end of the slide portion. As shown in FIG. 3, the escape slide and life raft assembly 10 may be detached from the fuselage 11 and a canopy 53 installed over inflatable vertical supports 54, shown in the other figures. The supports 54 are positioned on the upper sides of the upper side rail tubes 19 and 20 of the slide portion 12 and the upper support tubes 39 of the outrigger portions 36 and 37.

It is understood that this invention is capable of other modifications and adaptations by those having ordinary skill in the art and is more particularly defined by the appended claims.

I claim:

1. An escape slide and life raft assembly adapted to be inflated and extend from an elevated position to a lower surface, said assembly comprising a slide portion having a longitudinally extending inflatable side tube at each side thereof, an outrigger portion positioned adjacent said side tube, said outrigger portion having an inflatable support tube, in fluid communication with said side tube, a flexible passenger supporting sheet member extending between said support tube and said side tube, and a reefing means for retaining said outrigger portion against said slide portion, means for inflating said assembly to a first predetermined pressure while said outrigger portion is in the reefed condition, said reefing means including a continuous flap of sheet material having substantially the length of the support tube and extending around said support tube of said outrigger portion for urging said support tube against said side tube so that upon inflation of said assembly with said outrigger portion retained against said slide portion said support tube will only partially inflate and reinforce said side tube, said reefing means including a release means to release said reefing means to permit full inflation of said support tube so that during operation of said assembly as a raft said outrigger portion will provide space on said flexible sheet member for additional passengers and said assembly being inflated to a second predetermined pressure with said outrigger portion in the extended condition after release of said reefing means by said release means.

2. An escape slide and life raft assembly in accordance with claim 1 wherein said side tube is of a fabric stretchable at said first predetermined pressure to increase the volume of said assembly during extension of said slide portion and thereby minimize the reduction in pressure of said assembly during extension of said outrigger portion.

* * * * *